(12) United States Patent
Kobayashi

(10) Patent No.: US 10,398,019 B2
(45) Date of Patent: Aug. 27, 2019

(54) CIRCUIT STRUCTURE AND ELECTRICAL JUNCTION BOX

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventor: Takehito Kobayashi, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 15/771,687

(22) PCT Filed: Oct. 28, 2016

(86) PCT No.: PCT/JP2016/082046
§ 371 (c)(1),
(2) Date: Apr. 27, 2018

(87) PCT Pub. No.: WO2017/086129
PCT Pub. Date: May 26, 2017

(65) Prior Publication Data
US 2018/0310394 A1  Oct. 25, 2018

(30) Foreign Application Priority Data

Nov. 16, 2015 (JP) .................................. 2015-223889

(51) Int. Cl.
*H05K 1/02* (2006.01)
*H02G 3/16* (2006.01)
(Continued)

(52) U.S. Cl.
CPC ............. *H05K 1/0203* (2013.01); *H02G 3/03* (2013.01); *H02G 3/16* (2013.01); *H05K 1/181* (2013.01);
(Continued)

(58) Field of Classification Search
CPC .. H02G 3/03; H02G 3/16; H05K 7/20; H05K 1/181; H05K 2201/066;
(Continued)

(56) References Cited

U.S. PATENT DOCUMENTS

2010/0038133 A1* 2/2010 Senk .................. B60R 16/0238
174/72 B
2012/0195007 A1* 8/2012 Yanai .................... B60T 13/686
361/720

(Continued)

FOREIGN PATENT DOCUMENTS

JP  2015-156771 A  8/2015

OTHER PUBLICATIONS

Search Report for PCT/JP2016/082046, dated Jan. 24, 2017.

*Primary Examiner* — David M Sinclair
*Assistant Examiner* — Robert D Brown
(74) *Attorney, Agent, or Firm* — Honigman LLP

(57) ABSTRACT

A circuit structure that includes: an insulating heat transfer member that transfers heat from a bus bar to a heat dissipating member, is insulating, and is provided between the bus bar and the heat dissipating member; and a restricting member that restricts movement of the insulating heat transfer member that is caused by an increase in the temperature of the insulating heat transfer member, and is provided between the bus bar and the heat dissipating member. The restricting member is provided with heat transfer openings for bringing the insulating heat transfer member into contact with the bus bar, and, the insulating (Continued)

heat transfer member 80 has a smaller area than an opening area of the heat transfer openings, in a state of being in contact with the bus bar.

7 Claims, 8 Drawing Sheets

(51) Int. Cl.
  *H05K 7/20* (2006.01)
  *H02G 3/03* (2006.01)
  *H05K 1/18* (2006.01)
(52) U.S. Cl.
  CPC ......... *H05K 7/20* (2013.01); *H05K 2201/066* (2013.01); *H05K 2201/1003* (2013.01); *H05K 2201/10015* (2013.01); *H05K 2201/10022* (2013.01); *H05K 2201/10166* (2013.01); *H05K 2201/10272* (2013.01)

(58) Field of Classification Search
  CPC .......... H05K 2201/10015; H05K 2201/10022; H05K 2201/1003; H05K 2201/10166; H05K 2201/10272
  See application file for complete search history.

(56) References Cited

U.S. PATENT DOCUMENTS

| | | | |
|---|---|---|---|
| 2013/0294040 A1* | 11/2013 | Fukumasu | H02M 1/44 361/752 |
| 2013/0312931 A1* | 11/2013 | Sharaf | H05K 7/209 165/67 |
| 2013/0343018 A1* | 12/2013 | Hattori | H05K 5/0026 361/755 |
| 2016/0343641 A1* | 11/2016 | Hori | H01L 23/473 |
| 2017/0318659 A1* | 11/2017 | Chin | H05K 7/20472 |
| 2019/0045618 A1* | 2/2019 | Ota | H05K 1/0204 |

* cited by examiner

CIRCUIT STRUCTURE AND ELECTRICAL JUNCTION BOX

CROSS-REFERENCE TO RELATED APPLICATIONS

This application is the U.S. national stage of PCT/JP2016/082046 filed Oct. 28, 2016, which claims priority of Japanese Patent Application No. JP 2015-223889 filed Nov. 16, 2015.

TECHNICAL FIELD

The technology disclosed in the present specification is related to a circuit structure and an electrical junction box provided with the circuit structure, and is particularly related to technology for dissipating heat generated by electronic components in the circuit structure.

BACKGROUND

Technology disclosed in JP 2013-99071A, for example, is known as conventional technology for dissipating heat generated by electronic components in a circuit structure in a vehicle-mounted electrical component or the like. JP 2013-99071A discloses technology in which heat generated by electronic components is transferred to a heat sink (heat dissipating member) via a bus bar and an insulating heat transfer member and is dissipated from the heat sink. At this time, a thermosetting adhesive is conventionally used as the insulating heat transfer member. Also, in order to omit steps required for thermosetting, which involves increasing the temperature for heating and time for cooling, there are also cases where a room temperature setting adhesive is used instead of the thermosetting adhesive.

However, if a room temperature setting adhesive is used as the insulating heat transfer member, the hardness of the room temperature setting adhesive is normally less than the thermosetting adhesive, and thus the room temperature setting adhesive disposed between a bus bar and a heat dissipating member may escape to the surrounding region due to stress generated by cooling and heating cycles in the atmospheric temperature. That is to say, if the room temperature setting adhesive softens when the atmospheric temperature is high, the room temperature setting adhesive between a highly rigid bus bar and a heat dissipating member will be pushed out into the surrounding region. In this case, when the atmospheric temperature decreases, the amount of room temperature setting adhesive directly below an electronic component that is a heat-generating element may be insufficient. Accordingly, for example, there is concern of the boundary surfaces between the bus bar and the heat dissipating member coming apart. If the boundary surfaces between the bus bar and the heat dissipating member come apart, the heat transferred from the bus bar to the heat transferring member decreases, and thus the heat dissipation effect exhibited by the heat dissipating member is reduced.

Thus, it is conceivable to provide a restriction member for restricting such a room temperature setting adhesive from being pushed out into the surrounding region when the temperature is high. However, the restricting member is also affected by stress, which is caused by cooling and heating cycles in the atmospheric temperature, acting on the insulating heat transfer member, and it is conceivable that, when the amount of stress is high, the insulating heat transfer member may come out from the restricting member.

The technology disclosed in the present specification was completed based on circumstances such as those described above, and the present specification provides a circuit structure that can suppress a reduction in the heat dissipating effect exhibited by the heat dissipating member, even if a restriction member that restricts movement of the insulating heat transfer member caused by an increase in temperature is provided.

SUMMARY

A circuit structure disclosed in the present specification includes: a circuit board provided with a connection opening; a bus bar provided on a lower surface side of the circuit board; an electronic component electrically connected to the bus bar via the connection opening, from an upper surface side of the circuit board; a heat dissipating member that dissipates heat from the bus bar, and is provided on a surface side of the bus bar that is opposite to the surface that faces the circuit board; an insulating heat transfer member that transfers heat from the bus bar to the heat dissipating member, is insulating, and is provided between the bus bar and the heat dissipating member; and a restricting member that restricts movement of the insulating heat transfer member that is caused by an increase in the temperature of the insulating heat transfer member, and is provided between the bus bar and the heat dissipating member. The restricting member is provided with a heat transfer opening for bringing the insulating heat transfer member into contact with the bus bar, and the insulating heat transfer member has a smaller area than an opening area of the heat transfer opening, in a state of being in contact with the bus bar.

With the present configuration, the insulating heat transfer member has an area that is smaller than the opening area of the heat transfer opening, in a state of being in contact with the bus bar. Thus, even if the atmospheric temperature rises and the insulating heat transfer member moves, the insulating heat transfer member can move into a void region of the heat transfer opening. Accordingly, even if the amount of stress, which is caused by cooling and heating cycles in the atmospheric temperature, acting on the insulating heat transfer member is large, the insulating heat transfer member can be kept from coming out from restricting member. As a result, even if a restricting member that restricts movement of the insulating heat transfer member caused by an increase in temperature is used, a reduction in the heat dissipating effect exhibited by the heat dissipating member can be suppressed.

Note that, here, "movement of the insulating heat transfer member" includes expansion, displacement, shifting, and the like of the insulating heat transfer member caused by an increase in the atmospheric temperature. Also, the phrase "a state of being in contact" also includes an adhering state.

It is also preferable that, in the above-described circuit structure, the lower surface of the bus bar includes a first lower surface that has a component region that is a region of the bus bar on the lower surface side thereof and corresponds to a region of the bus bar on the upper surface side thereof where the electronic component is arranged, the heat transfer opening includes a first heat transfer opening that is open to the first lower surface, and the insulating heat transfer member is in contact with at least the first lower surface including the component region, via the first heat transfer opening.

With the present configuration, the insulating heat transfer member, in the range of the first heat transfer opening, is in contact with at least the first lower surface of the bus bar including the component region of the first lower surface of the bus bar. Thus, heat from the electronic component can be efficiently transferred to the heat dissipating member via the bus bar.

It is also preferable that, in the above-described circuit structure, the lower surface of the bus bar includes a second lower surface that does not include the component region, the heat transfer opening further includes a second heat transfer opening that is open to the second lower surface, and the insulating heat transfer member is in contact with the second lower surface via the second heat transfer opening.

With the present configuration, the insulating heat transfer member is also in contact with the second lower surface of the bus bar via the second heat transfer opening that is open to the second lower surface of the bus bar that does not include the component region of the bus bar. The heat from the electronic component also diffuses to the region of the bus bar that is not connected to the electronic component. For this reason, heat from the region of the bus bar that is not connected to the electronic component can be transferred by the insulating heat transfer member to the heat dissipating member via the insulating heat transfer member.

It is also preferable that, in the above-described circuit structure, the insulating heat transfer member has a peripheral portion located at an edge portion of the heat transfer opening, in a state of being in contact with the bus bar.

With the present configuration, when stress acts on the insulating heat transfer member, movement of the peripheral portion of the insulating heat transfer member, located at the edge portion of the heat transfer opening, can be limited, and movement of the insulating heat transfer member is mainly enabled by the peripheral portion of the insulating heat transfer member in which a void region is formed. Accordingly, disorderly movement of the insulating heat transfer member due to stress can be suppressed, and a reduction in the heat transferred from the electronic component to the heat dissipating member can be suppressed.

It is also preferable that, in the above-described circuit structure, the restricting member is a frame plate that is insulating, the frame plate includes a frame portion that forms an edge portion of the heat transfer opening, and has a protruding portion that protrudes toward the heat dissipating member, and the heat dissipating member has a groove into which the protruding portion of the frame portion is embedded.

With the present configuration, the restricting member is a frame plate that forms the edge portion of the heat transfer opening, and includes a frame portion provided with a protruding portion that protrudes toward the heat dissipating member. Also, the protruding portion of the frame portion is embedded in the groove of the heat dissipating member. Therefore, even if a room temperature setting adhesive is used as the insulating heat transfer member, for example, and the room temperature setting adhesive softens when the atmospheric temperature rises, the room temperature setting adhesive disposed in the heat transfer opening is kept from escaping to the surrounding region by the edge portion of the heat transfer opening.

It is preferable that, in the above-described circuit structure, the insulating heat transfer member is formed using a room temperature setting adhesive.

With the present configuration, because the insulating heat transfer member is a room temperature setting adhesive, steps required for thermosetting, which involves increasing the temperature for heating and time for cooling, can be omitted, and the movement restriction effect exhibited on the insulating heat transfer member by the restricting member when the atmospheric temperature rises can be better utilized.

Also, an electrical junction box disclosed in the present specification including: any of the circuit structures described above; and a case that houses the circuit structure.

With the technology disclosed in the present specification, a reduction in the heat dissipating effect exhibited by the heat dissipating member can be suppressed, even if the restricting member that restricts movement of the insulating heat transferring member caused by a rise in temperature is provided.

DESCRIPTION OF EMBODIMENTS

An embodiment will be described with reference to FIGS. 1 to 8.

Configuration of Electrical Junction Box

Figure 1:
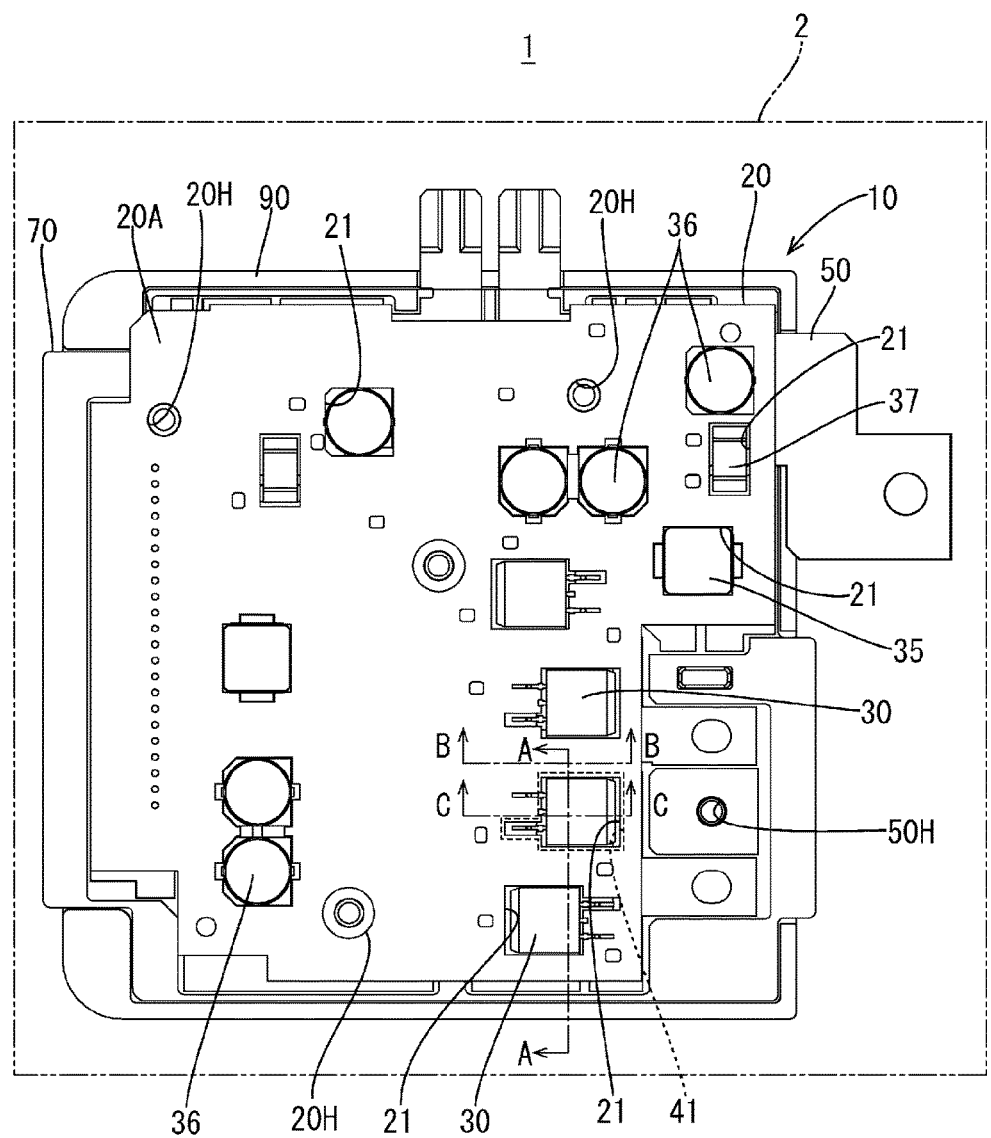
FIG. 1 is a schematic plan view of the inside of an electrical junction box according to an embodiment.

As shown in FIG. 1, an electrical junction box 1 of the present embodiment includes a circuit structure 10 and a case 2 made of a synthetic adhesive that houses the circuit structure 10. The electrical junction box 1 further includes a cover made of metal (not shown) that covers the circuit structure 10.

Configuration of Circuit Structure

The circuit structure 10 includes a circuit board 20, N channel MOSFETs (hereinafter simply referred to as "MOSFETs") 30, a plurality of bus bars 50, a frame plate 70, insulating heat transferring members 80, a heat dissipating plate 90, and the like. In the present embodiment, the circuit structure 10 is a DC-DC converter built into a vehicle. Note that the circuit structure 10 is not limited to this.

The circuit board 20 includes a plurality of connection openings 21 for connecting electronic components such as the MOSFETs 30 to a predetermined bus bar 50. As shown in FIG. 1, electronic components that generate heat such as the MOSFETs 30, a coil 35, capacitors 36, and a resistor 37 are connected to a corresponding bus bar 50 via a corresponding connection opening 21 by using solder, for example. Specifically, at least one connection terminal of a plurality of connection terminals of each electronic component is connected to a corresponding bus bar 50 via a connection opening 21.

The MOSFETs 30 include, for example, a main portion consisting of a semi-conductor and molded using a synthetic adhesive, and a gate terminal, a drain terminal, and a source terminal functioning as a plurality of connection terminals. The drain terminal and the source terminal are each connected to a corresponding bus bar 50. Note that the gate terminal is connected to wiring (not shown) formed on an upper surface 20A of the circuit board 20.

Also, two connection terminals of each of the coil 35, the capacitors 36, and the resistor 37, are connected to corresponding bus bars 50 via a corresponding connection opening 21.

Figure 2:
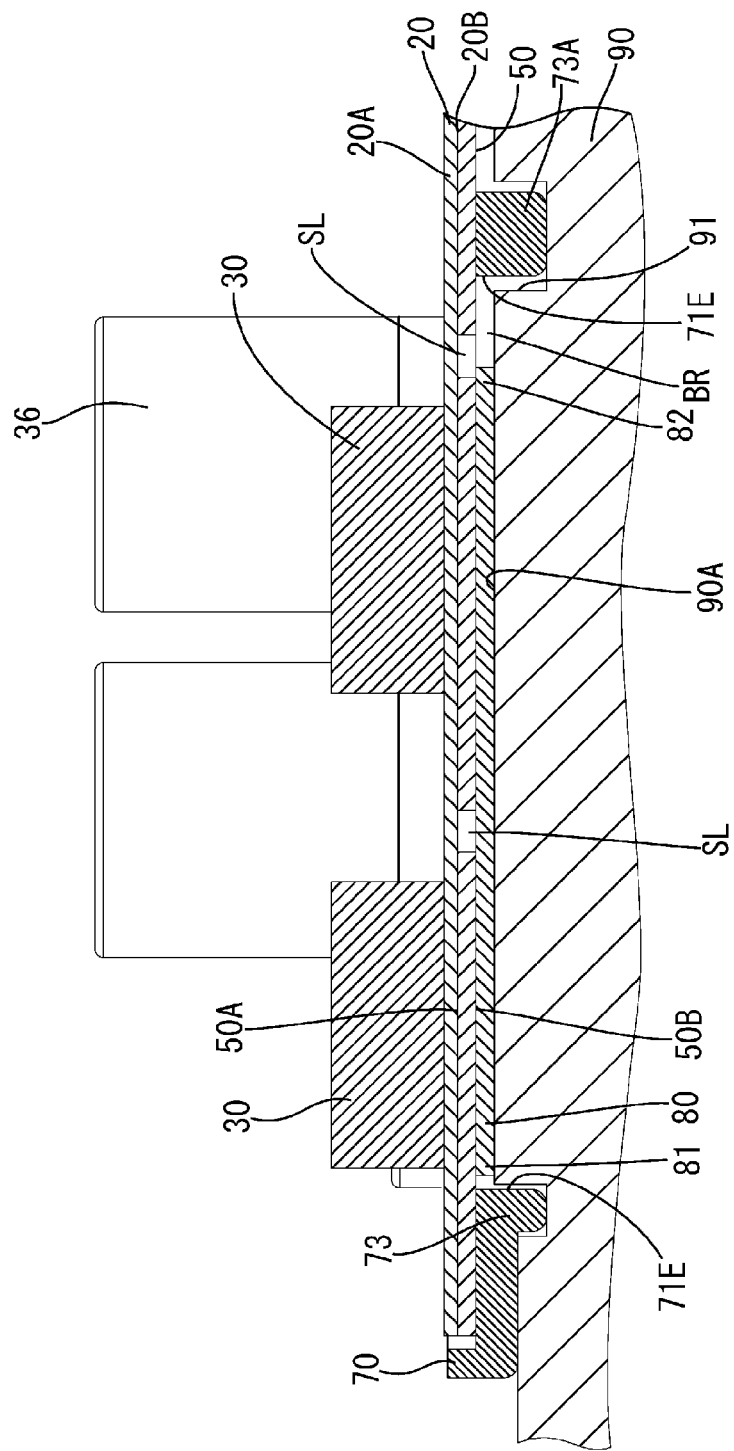
FIG. 2 is a cross-sectional view taken along line A-A in FIGS. 1 and 4.

As shown in FIG. 2, the plurality of bus bars 50 are provided on a lower surface 20B side of the circuit board 20. The plurality of bus bars 50 include a ground bus bar to which a ground potential is applied, and a power source bus bar to which a power source potential is applied, for example. The plurality of bus bars 50 are formed by pressing a metal plate into a predetermined shape, for example. The bus bars 50 have a substantially rectangular shape, and are disposed in a predetermined pattern with a gap SL left between adjacent bus bars 50.

Specifically, an adhesive sheet (not shown) that adheres the circuit board 20 and the plurality of bus bars 50 to each other is provided between the circuit board 20 and the plurality of bus bars 50. That is to say, each bus bar 50 is adhered to the lower surface 20B of the circuit board 20 via the adhesive sheet. The planar shape of the adhesive sheet is approximately the same as the planar shape of the circuit board 20.

Also, among the lower surfaces (50B and 50C) of the bus bars 50 are a first lower surface 50B that includes a component region 50R and a second lower surface 50C that does not include a component region 50R. Here, "component region 50R" means a region on the lower surface side of a bus bar that corresponds to a region on an upper surface 50A side of the bus bar on which an electronic component such as a MOSFET 30 is disposed, and is not the region where the electronic component is actually disposed. Note that the first lower surface 50B, the second lower surface 50C, and the component regions 50R are not limited to being formed on one bus bar 50, and may also be provided on a plurality of bus bars 50.

As shown in FIG. 2 etc, the frame plate 70 is provided between the plurality of bus bars 50 and the heat dissipating plate 90. Specifically, the frame plate 70 is fitted into a groove 91 provided in the heat dissipating plate 90.

Figure 3:
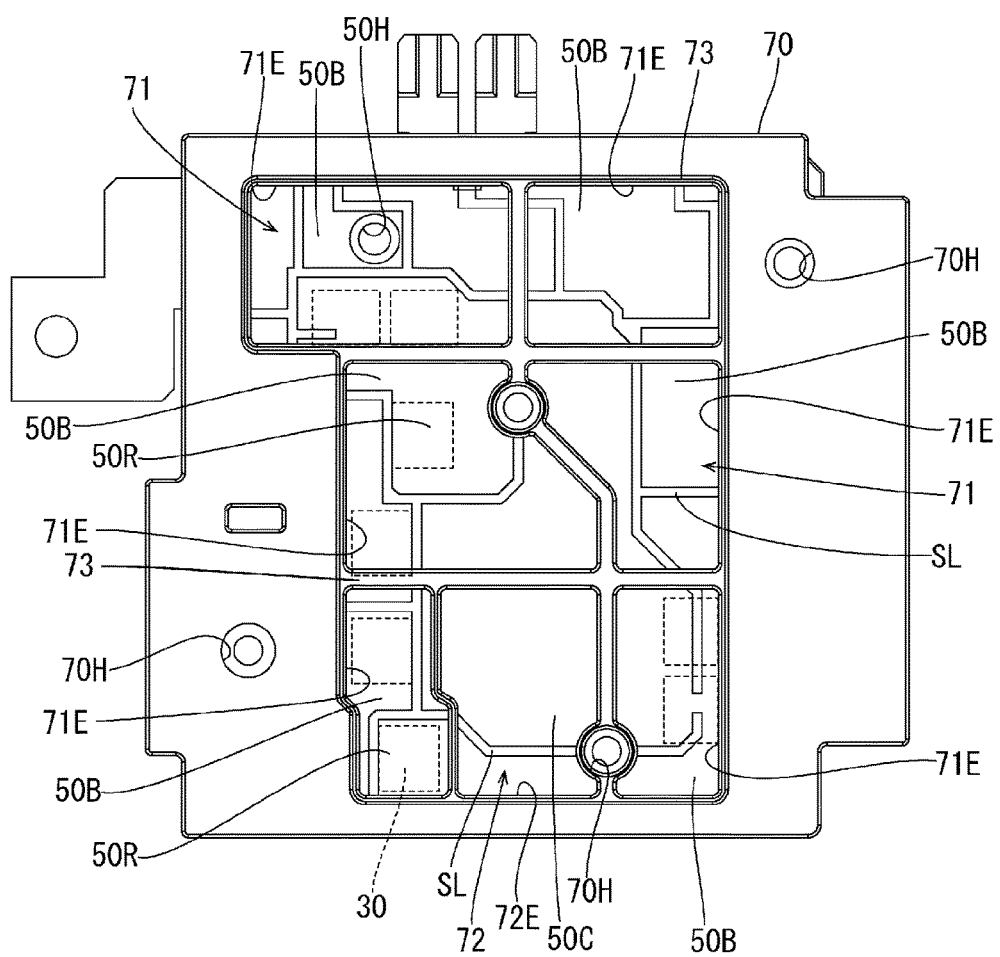
FIG. 3 is a plan view of the circuit structure from the lower surface thereof, from which a heat dissipating plate and an insulating heat transferring member have been removed.

As shown in FIG. 3 for example, the frame plate 70 includes first heat transfer openings 71, a second heat transfer opening 72, and a frame portion 73. The first heat transfer openings 71 and the second heat transfer opening 72 are openings for bringing the insulating heat transfer members 80 and the bus bars 50 into contact with each other. As shown in FIG. 3, the first heat transfer openings 71 are open to the first lower surfaces 50B of the bus bars that include the component regions 50R of bus bars that correspond to a position where an electronic component is disposed, in plan view.

On the other hand, as shown in FIG. 3, the second heat transfer opening 72 is open to the the second lower surface 50C of a bus bar that does not include a component region 50R of a bus bar that corresponds to a position where an electronic component is disposed, in plan view.

That is to say, the insulating heat transfer members 80 are in contact with the first lower surfaces 50B via the first heat transfer openings 71, and are in contact with the second lower surface 50C via the second heat transfer opening 72.

The frame portion 73 forms edge portions (71E and 72E) of the heat transfer openings (71 and 72), and includes a protruding portion 73A that protrudes toward the heat dissipating plate 90. As shown in FIG. 2, when the frame plate 70 is fitted into the groove 91 of the heat dissipating plate 90, the protruding portion 73A abuts against the bottom of the groove 91, and closes off the groove 91. Accordingly, the protrusion portion 73A keeps the insulating heat transfer members 80 from moving to another heat transfer opening 71 due to an increase in the atmospheric temperature. The frame plate 70 is an example of a "restricting member".

Also, when the frame plate 70 is fitted into the groove 91 of the heat dissipating plate 90, as shown in FIG. 2, the protrusion 73A of the frame plate 70 protrudes therefrom by a thickness corresponding to the distance from an upper surface 90A of the heat dissipating plate 90 to the insulating heat transfer member 80. This configuration partitions the insulating heat transfer members 80 in the heat transfer openings (71 and 72) of the frame plate 70.

In the present embodiment, the insulating heat transfer members 80 have predetermined planar shapes (see FIG. 4), and are room temperature setting adhesives in the form of attachable stickers. A room temperature setting adhesive is an adhesive that has insulating and heat conductive properties, and sets at room temperature. Note that the insulating heat transfer members 80 are not limited to a room temperature setting adhesive in the form of an attachable sticker.

Figure 4:
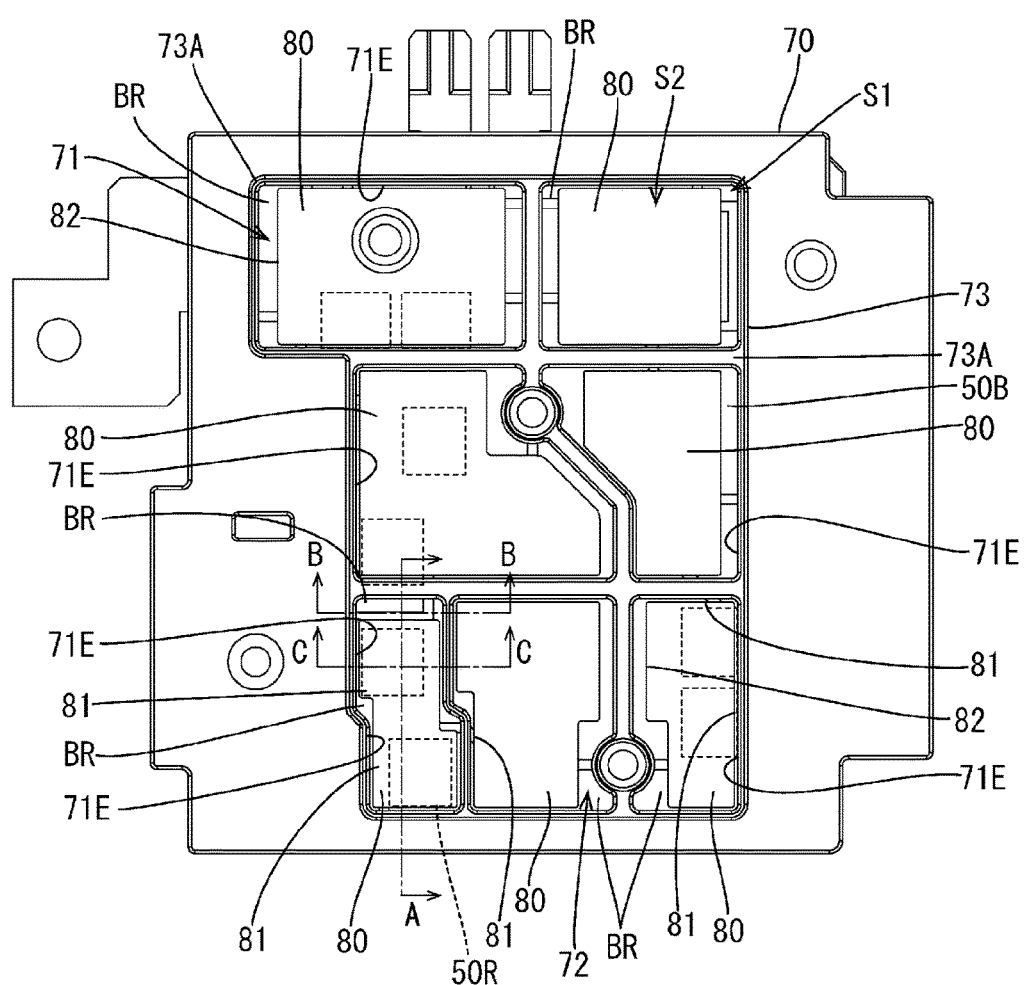
FIG. 4 is a plan view of the circuit structure from the lower surface thereof, from which a heat dissipating plate has been removed.
Figure 5:
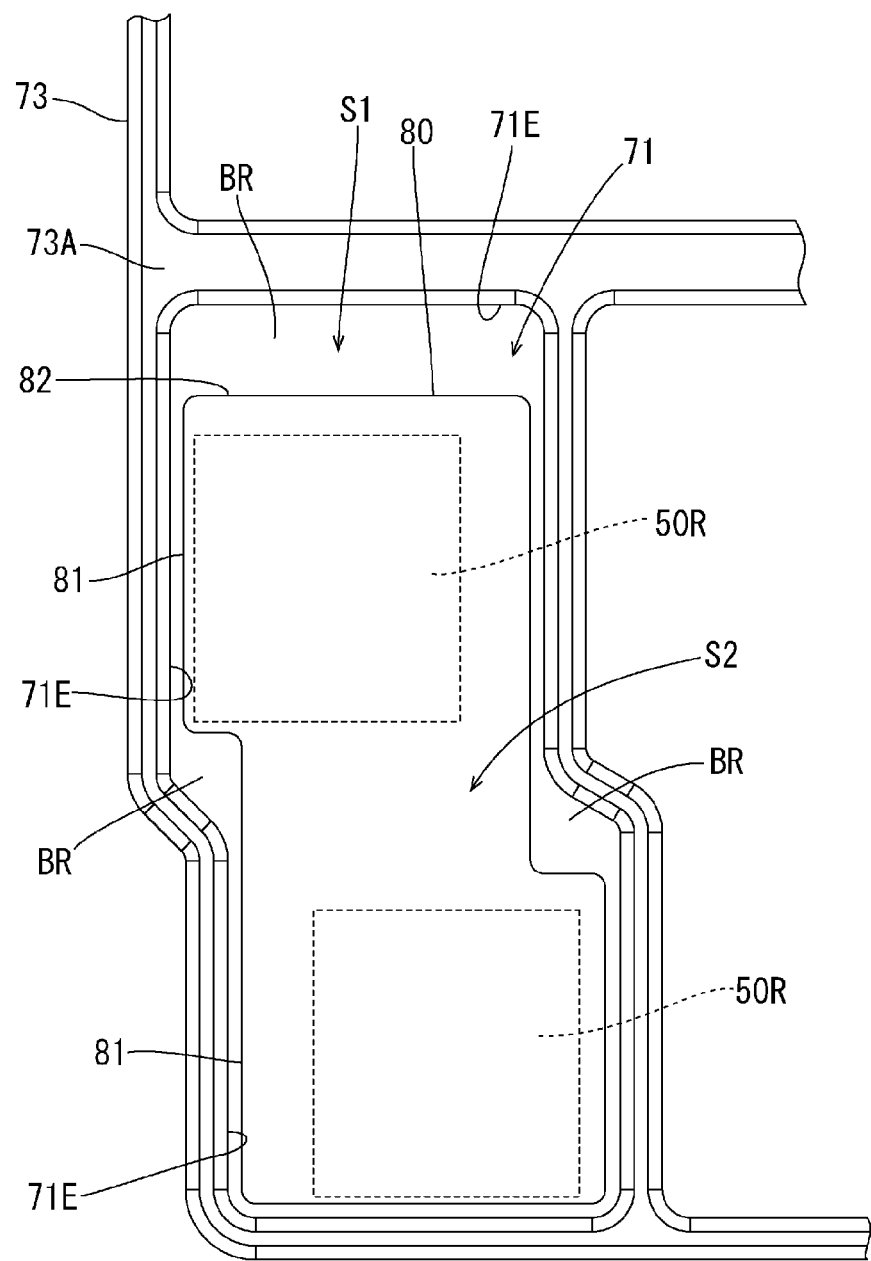
FIG. 5 is a partially expanded cross-sectional diagram of FIG. 4.

As shown in FIG. 2, the insulating heat transfer members 80 are provided between the bus bars 50 and the heat dissipating plate 90, are insulating, and transfer heat from the bus bars 50 caused by heat generated by the electronic components to the heat dissipating plate 90. As shown in FIGS. 4 and 5, the insulating heat transfer members 80 have an area S2 that is smaller than an opening area S1 of the heat transfer openings (71 and 72) of the frame plate 70, and have a planar shape in which a void region BR is formed in the heat transfer openings (71 and 72), the void region BR being a region where no insulating heat transfer member 80 is present.

Also, as shown in FIGS. 4 and 5, the insulating heat transfer members 80 provided in the first heat transfer openings 71 are in contact with the bus bars 50 at regions including at least the component regions 50R of bus bars.

Figure 7:
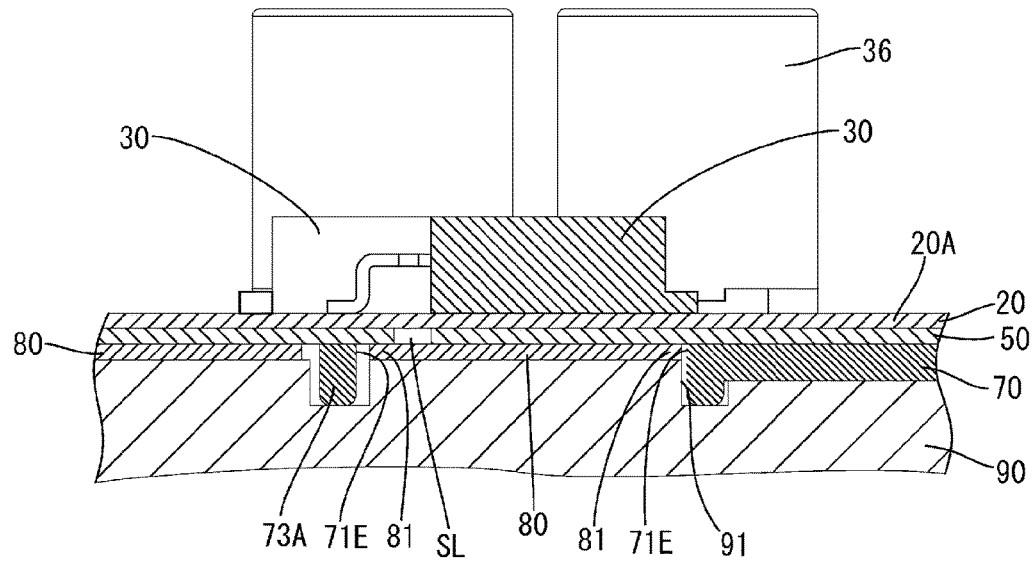
FIG. 7 is a cross-sectional diagram taken along line C-C in FIGS. 1 and 4.

Also, as shown in FIGS. 5 and 7, in a state where an insulating heat transfer member 80 provided in a first heat transfer opening 71 is in contact with a bus bar 50, a peripheral portion 81 of the insulating heat transfer member 80 in which the void region BR is not formed is located at the edge portions 71E of the first heat transfer opening 71.

Figure 6:
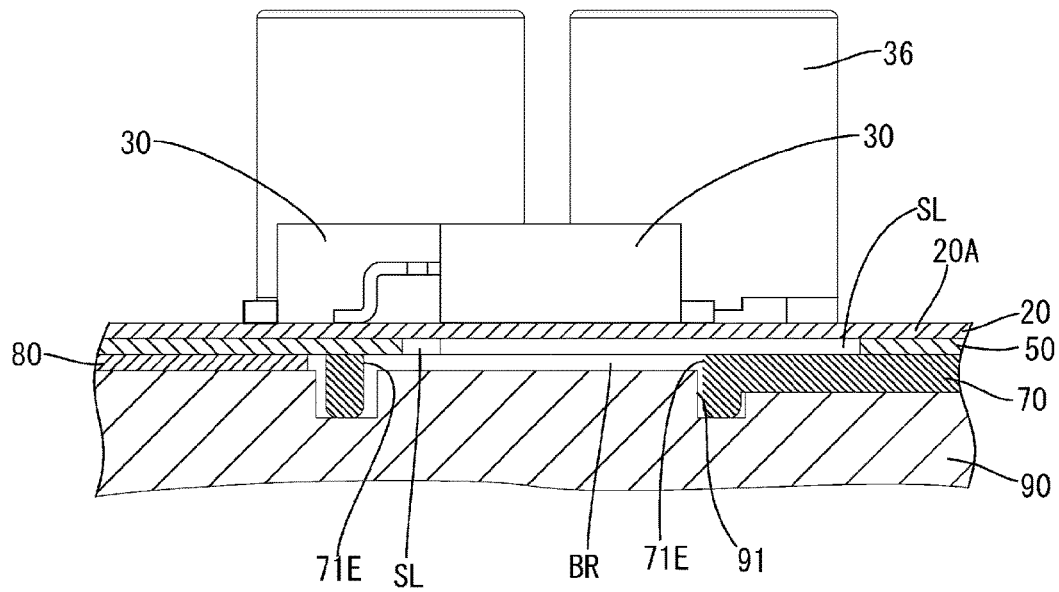
FIG. 6 is a cross-sectional diagram taken along line B-B in FIGS. 1 and 4.

On the other hand, as shown in FIGS. 5 and 6, a peripheral portion 82 of the insulating heat transfer member 80 that forms the void region BR is not located at the edge portions 71E of the first heat transfer opening 71.

Also, as shown in FIG. 4, an insulating heat transfer member 80 that is in contact with a bus bar 50 is also provided in the second heat transfer opening 72.

As shown in FIG. 2, the heat dissipating plate 90 is provided on the surface 50B side of the plurality of bus bars 50 that is opposite to the surface 50A that faces the circuit board 20, via the insulating heat transfer members 80. The heat dissipating plate 90 is a plate-shaped member that is made of a metal material with excellent heat conducting properties such as aluminum, an aluminum alloy, or the like, and has the function of dissipating heat that is generated by electronic components that generate heat such as the MOSFETs 30. The heat dissipating plate 90 is adhered on the lower surface side of the bus bars 50 by the insulating heat transfer members 80, which are a room temperature setting adhesive here.

Figure 8:
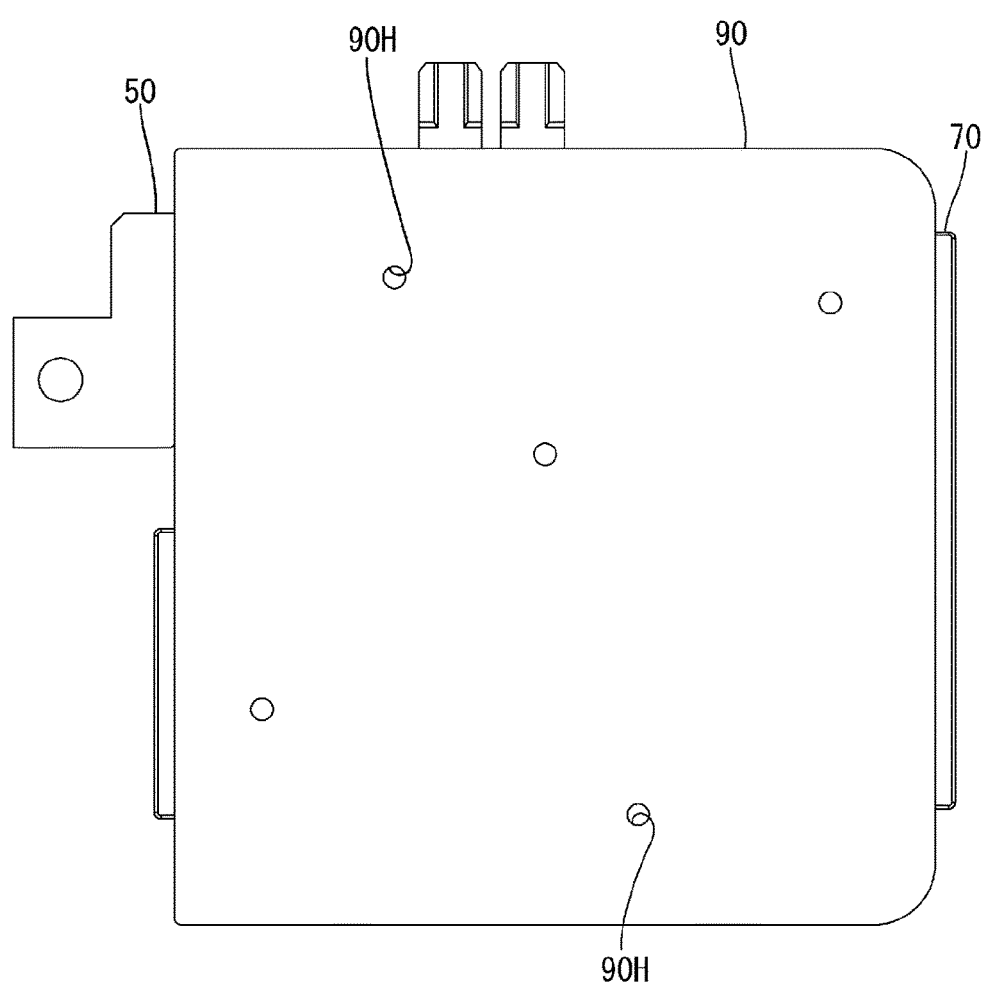
FIG. 8 is a plan view of the circuit structure taken from the lower surface thereof.

Also, as shown in FIG. 8, a plurality of attachment screw holes 90H are formed in the heat dissipating plate 90, and a plurality of attachment holes 20H are formed at positions that correspond to the plurality of attachment screw holes 90H, in the circuit board 20 (see FIG. 1). Also, at positions that correspond to the plurality of attachment holes 20H, a plurality of through-holes 50H (see FIG. 3) are formed in predetermined bus bars 50, and a plurality through-holes 70H (see FIG. 3) are formed in the frame plate 70. Then, by passing screws (not shown) from the plurality of attachment holes 20H of the circuit board 20, through the through holes, and into the plurality of attachment screw holes 90H in the heat dissipating plate 90 and fastening them, all members from the circuit board 20 to the heat dissipating plate 90 are fixed into one unit.

Also, the circuit board 20 is shielded by attaching a cover made of metal (not shown) to the upper portion of the circuit board 20. Specifically, by fixing a cover made of metal to the ground bus bar included in the plurality of bus bars 50, electronic components such as the MOSFETs 30 on the circuit board 20 are shielded from static electricity.

Schematic Manufacturing Process of Electrical Junction Box

Next, an example of a manufacturing process of the electrical junction box 1 according to the present embodiment will be described. First, pressing is performed in a state where an adhesive sheet (not shown) that has been cut out into a predetermined shape is overlaid onto a lower surface 20B of the circuit board 20 on the upper surface of which a conduction path has been formed using a print wiring technique, and the plurality of bus bars 50 are arranged in a predetermined pattern. Accordingly, the circuit board 20 and the plurality of bus bars 50 are adhered and fixed to each other via the adhesive sheet. In this state, portions of the upper surfaces of the plurality of bus bars 50 (region where the source and drain terminals of the MOSFETs 30 are to be connected, etc) are in a state of being exposed via the connection openings 21 of the circuit board 20.

Next, solder is applied to predetermined positions of the circuit board 20 using screen printing. Then, electronic components such as the MOSFETs 30 are mounted to the predetermined positions, and the solders are subjected to reflow.

Next, the frame plate 70 is fitted into the groove 91 of the upper surface 90A of the heat dissipating plate 90. Then, the insulating heat transfer members 80, which are a room temperature setting adhesive, are attached to the upper surface 90A of the heat dissipating plate 90, via the first and second heat transfer openings 71 and 72 of the frame plate 70. The insulating heat transfer members 80 are formed to have planar shapes that correspond to the shapes of the openings 71 and 72. Note that, instead of the upper surface 90A of the heat dissipating plate 90, the insulating heat transfer members 80 may be attached to the bus bars 50 at predetermined positions.

Next, the circuit board 20 onto which the electronic components and the plurality of bus bars 50 are disposed is overlaid from above, and all members from the circuit board 20 to the heat dissipating plate 90 are made into one unit, and fastened with screws, for example. At this time, the insulating heat transfer members 80 are in contact with the bus bars 50 and fall within the regions of the heat transfer openings 71 and 72 in the frame plate 70. Finally, the electrical junction box 1 is realized by housing the circuit board 20 overlaid onto the heat dissipating plate 90 (circuit structure 10) in the case 2. Note that the insulating heat transfer members 80 set in a room temperature environment after a predetermined period of time, in a state where the bus bars 50 and heat dissipating plates 90 are adhered to each other.

Effects of the Present Embodiment

In the present embodiment, as described above, the room temperature setting adhesive (insulating heat transfer members) 80 has an area S2 that is smaller than an opening area S1 of the heat transfer openings (71 and 72). In other words, the room temperature setting adhesive 80 has such a planar shape that a void region BR where there is no room temperature setting adhesive 80 is formed in the heat transfer openings (71 and 72). Therefore, even if the room temperature setting adhesive 80 moves due to an increase in the atmospheric temperature, the room temperature setting adhesive 80 can move into the void region BR. Accordingly, even if the amount of stress, which is generated by cooling and heating cycles in the environment temperature, acting on the room temperature setting adhesive 80 is large, the room temperature setting adhesive 80 can be kept from coming out from the frame plate 70 (restricting member). As a result, even if the frame plate 70 that restricts movement of the room temperature setting adhesive 80 caused by an increase in the temperature of the room temperature setting adhesive 80 is provided, a decrease in the heat dissipating effect exhibited by the heat dissipating plate 90 can be suppressed.

Also, the room temperature setting adhesives 80 in the regions of the first heat transfer openings 71 are in contact with at least the bus bars 50 including the component regions 50R of the first lower surface 50B of the bus bars. Therefore, heat from the MOSFETs 30 can be efficiently transferred to the heat dissipating plate 90 via the bus bars 50.

Also, the room temperature setting adhesive 80 is also in contact with a bus bar via the second heat transfer opening 72 that opens to the second lower surface 50C of the bus bar that does not include a component region 50R of the bus bar. Heat from the MOSFETs 30 also dissipates to regions of the bus bars where the MOSFETs 30 are not connected. Therefore, by using the room temperature setting adhesive 80 that corresponds to the second heat transfer opening 72, heat from regions of the bus bars where electronic components such as the MOSFETs 30 are not connected can be transferred to the heat dissipating plate 90 via the room temperature setting adhesive 80. Note that the room temperature setting adhesive 80 disposed in the second heat transfer opening 72 may also be omitted.

Also, in a state of being in contact with the bus bars 50, the room temperature setting adhesive 80 has the peripheral portion 81 (peripheral portion at which the void region BR is not formed) where the edge portions (71E and 72E) of the heat transfer openings (71 and 72) are located. Thus, when stress acts on the room temperature setting adhesive 80, movement of the peripheral portion 81 of the room temperature setting adhesive 80 is limited, and movement of the room temperature setting adhesive 80 is mainly enabled by the peripheral portion 82 of the room temperature setting adhesive 80 that forms the void region BR. Accordingly, disorderly movement of the room temperature setting adhesive 80 caused by stress generated by cooling and heating cycles is suppressed, and a reduction in the heat transferred from the MOSFETs 30 to the heat dissipating plate 90 can be suppressed.

Also, the restricting member forms the edge portions (71E and 72E) of the heat transfer openings, and is formed by the frame plate 70 that includes the frame portion 73 that has the protruding portion 73A protruding toward the heat dissipating plate 90. The protruding portion 73A of the frame portion is embedded in the groove 91 of the heat dissipating plate 90. Therefore, even if the room temperature setting adhesive 80 softens when the temperature of the room temperature setting adhesive 80 rises due to an increase in the atmospheric temperature, the room temperature setting adhesive 80 disposed in the heat transfer openings (71 and 72) can be kept from escaping to the surrounding region by the edge portions (71E and 72E) of the heat transfer openings. Note that the frame portion 73 may also not include the protruding portion 73A. At this time, the heat dissipating plate 90 may also not be provided with the groove 91, and the frame portion 73 is provided on the heat dissipating plate 90.

Also, the insulating heat transfer members 80 are formed by a room temperature setting adhesive, and thus steps required for thermosetting, which involves increasing the temperature for heating and time for cooling, can be omitted, and the movement restricting effect of the insulating heat transfer member exhibited by the frame plate 70, which is a restricting member, can be better utilized when the temperature of the room temperature setting adhesive 80 increases due to an increase in the atmospheric temperature.

Other Embodiments

The technology disclosed in the present specification is not limited to the embodiment described in the above description with reference to the drawings, and the following types of aspects are included, for example.

In the embodiment described above, the shape of the heat transfer openings (71 and 72) is not limited to that shown in FIGS. 3 and 4. The shape of the heat transfer openings (71 and 72) may also be appropriately changed according to the arrangement of electronic components that generate heat. Also, the planar shapes of the insulating heat transfer members 80 are also not limited to those shown in FIG. 4. The shapes of the insulating heat transfer members 80 may also be appropriately changed according to the shapes of the heat transfer openings (71 and 72).

In the embodiment described above, an example was shown in which a room temperature setting adhesive in the form of an attachable sticker is used as the insulating heat transfer members 80, but there is no limit to this. For example, a high-temperature setting adhesive or an insulating heat transfer member that has no adhesion may also be used as the insulating heat transfer members. Alternatively, an insulating heat transfer member may also be an insulating heat transfer member with no adhesion and to which an adhesive is attached to one surface thereof. Also, the insulating heat transfer members may also not be in the form of an attachable sticker.

Even if such an insulating heat transfer member is used, and even if a restricting member that restricts movement of the insulating heat transfer member caused by an increase in temperature is provided, a decrease in the heat dissipating effect exhibited by the heat dissipating member can be suppressed. Note that here "movement of the insulating heat transfer member" includes swelling, displacement, shifting, and the like of the insulating heat transfer member caused by an increase in the atmospheric temperature.

The invention claimed is:

1. A circuit structure comprising:
a circuit board provided with a connection opening;
a bus bar provided on a lower surface side of the circuit board;
an electronic component electrically connected to the bus bar via the connection opening, from an upper surface side of the circuit board;
a heat dissipating member that dissipates heat from the bus bar, and is provided on a surface side of the bus bar that is opposite to the surface that faces the circuit board;
an insulating heat transfer member that transfers heat from the bus bar to the heat dissipating member, is insulating, and is provided between the bus bar and the heat dissipating member; and
a restricting member that restricts movement of the insulating heat transfer member that is caused by an increase in the temperature of the insulating heat transfer member, and is provided between the bus bar and the heat dissipating member,
wherein the restricting member is provided with a heat transfer opening for bringing the insulating heat transfer member into contact with the bus bar, and
the insulating heat transfer member has a smaller area than an opening area of the heat transfer opening, in a state of being in contact with the bus bar.

2. The circuit structure according to claim 1,
wherein the lower surface of the bus bar includes a first lower surface that has a component region that is a region of the bus bar on the lower surface side thereof and corresponds to a region of the bus bar on the upper surface side thereof where the electronic component is arranged,
the heat transfer opening includes a first heat transfer opening that is open to the first lower surface, and
the insulating heat transfer member is in contact with at least the first lower surface including the component region, via the first heat transfer opening.

3. A circuit structure according to claim 2,
wherein the lower surface of the bus bar includes a second lower surface that does not include the component region,
the heat transfer opening further includes a second heat transfer opening that is open to the second lower surface
and the insulating heat transfer member is in contact with the second lower surface via the second heat transfer opening.

4. The circuit structure according claim 1,
wherein the insulating heat transfer member has a peripheral portion located at an edge portion of the heat transfer opening, in a state of being in contact with the bus bar.

5. The circuit structure according to claim 1,
wherein the restricting member is a frame plate that is insulating,
the frame plate includes a frame portion that forms an edge portion of the heat transfer opening, and has a protruding portion that protrudes toward the heat dissipating member, and
the heat dissipating member has a groove into which the protruding portion of the frame portion is embedded.

6. The circuit structure according to claim 1, wherein the insulating heat transfer member is formed using a room temperature setting adhesive.

7. An electrical junction box comprising:
the circuit structure according to claim 1; and
a case that houses the circuit structure.

* * * * *